(12) United States Patent
Linder et al.

(10) Patent No.: US 9,177,082 B2
(45) Date of Patent: Nov. 3, 2015

(54) DRAWING AUTOMATION IN COMPUTER AIDED DESIGN SYSTEMS

(75) Inventors: James Darrow Linder, Brea, CA (US); Shrinivas Soman, Cypress, CA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 9 days.

(21) Appl. No.: 13/273,317

(22) Filed: Oct. 14, 2011

(65) Prior Publication Data

US 2013/0097489 A1    Apr. 18, 2013

(51) Int. Cl.
*G06F 17/50*   (2006.01)
*G06T 15/40*   (2011.01)

(52) U.S. Cl.
CPC ............... *G06F 17/50* (2013.01); *G06T 15/40* (2013.01)

(58) Field of Classification Search
CPC ... G06F 17/241; G06F 17/50; G06F 2217/06; G06F 17/5086; G06F 2217/02; G06T 15/40
USPC ......... 715/211, 221, 226, 243, 248, 249, 251, 715/964
See application file for complete search history.

(56) References Cited

U.S. PATENT DOCUMENTS

| | | | | |
|---|---|---|---|---|
| 5,740,425 | A * | 4/1998 | Povilus | 1/1 |
| 6,999,907 | B2 * | 2/2006 | Smith | 703/1 |
| 7,280,123 | B2 * | 10/2007 | Bentley et al. | 345/629 |
| 7,755,622 | B2 * | 7/2010 | Yvon et al. | 345/420 |
| 8,086,950 | B2 * | 12/2011 | Smith et al. | 715/208 |
| 8,249,732 | B2 * | 8/2012 | Stephens et al. | 700/98 |
| 8,319,792 | B2 * | 11/2012 | Bussey et al. | 345/619 |
| 2001/0037190 | A1 * | 11/2001 | Jung | 703/1 |
| 2004/0267550 | A1 * | 12/2004 | Hsu et al. | 705/1 |
| 2005/0071135 | A1 * | 3/2005 | Vredenburgh et al. | 703/1 |
| 2007/0288504 | A1 * | 12/2007 | Kagawa et al. | 707/102 |
| 2011/0063328 | A1 * | 3/2011 | Herman et al. | 345/681 |

OTHER PUBLICATIONS

Solveig Haugland, "How to make text wrap inside an object in OpenOffice.org Draw using the 'word wrap text in shape' option", published: Mar. 19, 2009, pp. 1-7.*
PlanDesign FT V2.5 Manual, Dokumentationen Nemetschek Technology, XX, XX, Dec. 1, 2000, XP007901976. (180 pages).
Anonymous; Kurzvorstellung PlanTeam-Server, Jun. 1, 2010, XP055047328, Berlin, Germany, Retrieved from the Internet: URL: http://www.weltweibau.de/de/PlanTeam-Server/Kurzvorstellung_PlanTeam-Server.pdf, retrieved on Dec. 10, 2012. (26 pages).
PCT Search Report mailed Dec. 18, 2012, for PCT Application No. PCT/US2012/057182. (12 pages).

* cited by examiner

*Primary Examiner* — Wilson Tsui (57) ABSTRACT

Methods for computer aided design (CAD) and corresponding systems and computer-readable mediums. A method includes performing a setup process to instantiate a booklet of CAD drawings. The method includes receiving a user selection of a template from a user. The method includes receiving geometry content information from the user and receiving reference geometry from a user. The method includes creating the booklet of CAD drawings based on the template, geometry content information and reference geometry. A CAD system maintains a CAD drawing booklet, the CAD drawing booklet associated with a plurality of drawings each including a sheet collection, and each drawing associated with at least one component.

17 Claims, 6 Drawing Sheets

DRAWING AUTOMATION IN COMPUTER AIDED DESIGN SYSTEMS

TECHNICAL FIELD

The present disclosure is directed, in general, to computer-aided design, visualization, and manufacturing systems, product lifecycle management ("PLM") systems, product data management ("PDM") systems, and systems that manage data for products and other items (individually and collectively, "computer aided design" systems or CAD systems).

BACKGROUND OF THE DISCLOSURE

CAD systems are useful for designing and manufacturing products and pads. Improved systems are desirable.

SUMMARY OF THE DISCLOSURE

Various disclosed embodiments include methods for drawing automation in CAD systems and corresponding systems and computer-readable mediums. A method includes performing a setup process to instantiate a booklet of CAD drawings. The method includes receiving a user selection of a template from a user. The method includes receiving geometry content information from the user and receiving reference geometry from a user. The method includes creating the booklet of CAD drawings based on the template, geometry content information and reference geometry. A CAD system maintains a CAD drawing booklet, the CAD drawing booklet associated with a plurality of drawings each including a sheet collection, and each drawing associated with at least one component.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Currently, CAD systems do not support the ability to generate a set of detailed or assembly drawing sheets to the extent that customers need. Furthermore, the drawings generated need to be scaled to a volume foreign to CAD systems today, and often require thousands of sheets for a single drawing that spans multiple physical files in storage.

One management approach is to break up large drawings into multiple, physical drawings, but systems cannot collect and manage these together as a single unit and maintain the proper relationships across physical file boundaries. Further, current systems do not permit a user to annotate these drawings in an automated way.

Disclosed embodiments provide a "drawing booklet" to address these issues. As used herein, a "drawing booklet" is a set of services and tools that can collect introductory drawing sheets (index, revision table, construction notes, etc.) and detail sheets and/or assemblies into a series of part containers that appear and can be managed as a single cohesive drawing unit.

Drawing booklets as disclosed herein can be used, for example, for arrangement drawings, assembly drawings, installation drawings, and detail drawings in CAD systems. Drawing booklets provide significant technical advantages in memory and performance efficiencies when interacting with drawings containing many sheets while maintaining a relationship between all of the physical files.

To handle annotating of drawing booklets, various embodiments also include a set of automation tools that allows users and other software and systems to automatically or interactively create and manage a large number of drawings and drafting Objects. The systems and methods disclosed herein are scalable in terms of partial automation to full automation based on customer's needs.

Various embodiments can include one or more of the following components, described in more detail below, among others:

Drawing Booklet Wizard—This component provides a means for creating drawing booklets; a booklet can be made up of hundreds of drawings.

Rule Driven Drafting Objects—This component delivers a complete and scalable automation capability for all drafting objects like views, tables, notes and dimensions.

Annotation Distribution—This component acts as an interactive tool to distribute annotations in a drawing view and allows annotations created via rules to be well distributed.

Annotation Management—This component allows two options when re-running the automation program: to clean up of annotations created from previous run or to preserve annotations from previous run and don't create duplicates.

Template Regions—This component provides means to divide a drawing sheet into various areas called regions. Each region can contain one or more drafting objects with rules.

Various embodiments can automatically generate a drawing in a "generic" fashion that is closer to a full production drawing than known in the art. Various embodiments include an overall framework for drawing production and management for which companies can build and customize via business rules.

As described in more detail below, the process of the drawing generation can be controlled by business rules. These rules drive every part of the process the user interface (UI), the configuration of the UI, the contents of the drawings, the model geometry used, etc. As a result, two companies that operate under different drawing standards, in unrelated industries, and with completely different documentation requirements can utilize the framework and rule interface disclosed herein to build a near-production drawing with little more than a few button clicks.

The framework can use a rule knowledge base, templates, etc. to generate the results which are stored in the form of a drawing booklet, as described below.

Disclosed embodiments bring these concepts together with a cohesive process and sequence in a CAD system.

Figure 1:
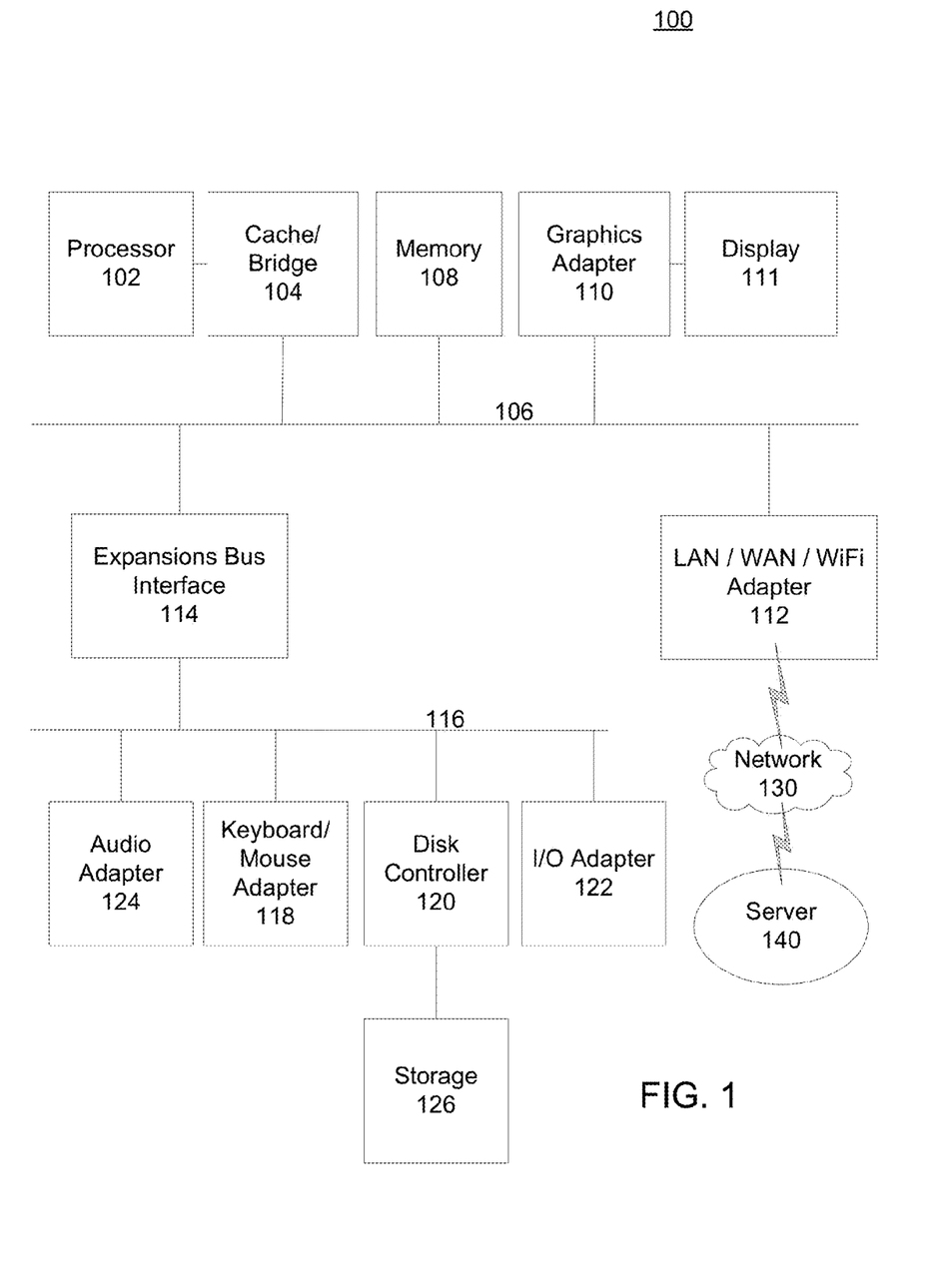
FIG. 1 depicts a block diagram of a data processing system in which an embodiment can be implemented.

FIG. 1 depicts a block diagram of a data processing system in which an embodiment can be implemented, for example, as a CAD system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer. etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Automating the construction of a drawing, in accordance with disclosed embodiments, requires input and customization from many different sources. Everything from the design, client, and audience to the manufacturing process used can dictate aspect or contents of a drawing. Furthermore, the drafting standards can simply act as a "guide" for drawing construction and do not necessarily dictate the exact drawing content.

In various embodiments, a user provides customizable inputs into a fully automated drawing process, which are received by the system. These inputs are often driven by such factors as engineering know-how, business rules, templates, and company standards.

Figure 2:
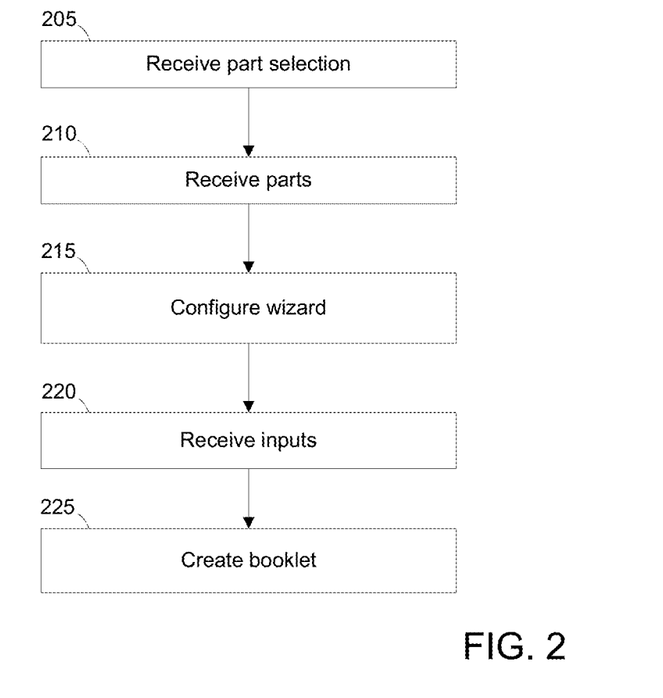
FIG. 2 illustrates an initial drawing automation process that can be used for constructing a drawing.

FIG. 2 illustrates an initial drawing automation process that can be used for constructing a drawing.

The system receives a user selection of parts (primary and background) (step 205). "Receiving", as used herein, can include loading from storage, receiving from another system or process, receiving via an interaction with a user, and otherwise.

The system receives the selected parts (step 210).

The system configures a drawing automation wizard using at least one configuration rule (step 215). A "wizard" as used herein, refers to a system process and user interface that guides a user in accomplishing a task. The drawing automation wizard, for example, can guide the user in creating a drawing in accordance with disclosed embodiments.

The system receives the inputs required for the drawing elements (step 220). These can be received from a user, and the system can evaluate and validate each of the inputs as they are received. As part of this step, the system can receive and use templates corresponding to the inputs.

Inputs to the wizard can include, among others, a rule selection, a booklet folder, a part selection, a template selection, view positioning, reference geometry, and attributes.

A drawing template can be built using template tools, and can contain sheets and view, view orientation rules, table templates and rules, and regions and rules, among others.

The system creates a booklet and stores any received parts, templates, and inputs as associated with the booklet (step 25).

After the initial drawing automation process is complete, the system can perform a drawing process as described herein.

Each of the steps during this process can be further broken down—where inputs and dependencies are gathered and collected. Once the data is collected and the primary business rules are evaluated, the process of constructing the drawing begins and is repeated for each unique drawing in the booklet as follows.

Figure 3:
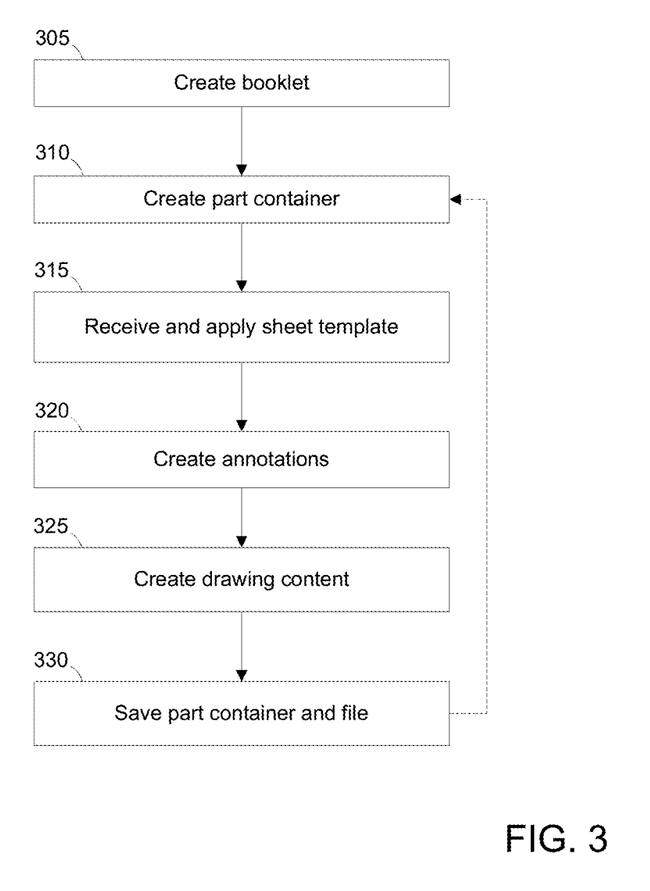
FIG. 3 illustrates a drawing creation process in accordance with disclosed embodiments.

FIG. 3 illustrates a drawing creation process in accordance with disclosed embodiments.

The system creates a booklet (step 305), if that was not done as part of an initial process as in step 225 above.

The system creates a part container (step 310).

The system receives and applies a sheet template for the drawing (step 315). This step can include evaluating any template rules in the sheet template.

The system creates annotations for the drawing (step 320). This step can include evaluating any annotation rules for the drawing.

The system can receive a user interaction to create the drawing content (step 325), and can use a drawing automation engine as described herein. This process can include updating and reapplying any table rules.

The system saves the part container and file (step 330).

The process can repeat to step 310 for each part container.

Some embodiments use a drawing automation engine for the drawing automation process. The engine is used to build drawings, to relate them to the booklet, and to populate the views, symbols, tables, and annotations on the drawing through the use of rules.

This framework is system and company independent, and allows for wide variations in the results by simple modifications to core rules. The processing of each part can be performed through the drawing automation wizard.

The drawing automation engine can create a part by receiving drawing inputs and parameters, creating a new part using the parameters, applying any booklet rules, and storing the part. Booklet rules can be received from and stored in the associated booklet, and any additional rules received from a user can be used to update the booklet rules.

The drawing automation engine can perform a part selection including receiving components and other assembly settings, such as a reference set and others, to be added to a drawing file. The drawing automation wizard can initialize a part including adding attributes from the drawing automation wizard and adding other settings such as XML, defaults, etc.

The construction of the drawing parts can be done using a drawing template. Once the part is constructed, the engine can populate that drawing with content. The template provides the framework for the content. The business rules interact with the framework to build a production drawing.

Figure 4:
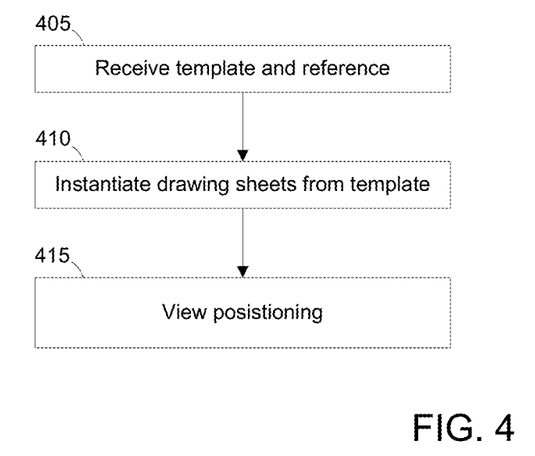
FIG. 4 illustrates a process of building a drawing from a template in accordance with disclosed embodiments.

FIG. 4 illustrates a process of building a drawing from a template in accordance with disclosed embodiments.

The system receives a drawing template and any selected reference (step 405). The template can be received, in some cases, from the drawing wizard.

The system instantiates drawing sheets from the template (step 410). This step can include applying any template rules or copying any template rules to a drawing part. This step can also include storing any reference rules or other rules that are to be applied to the drawing.

The system performs a view positioning process using the sheets and template (step 415). This step can include adding and orienting views of the drawings, applying any view rules from the template, region processing (including adding any necessary new sheets), and managing any drawing tables that must be updated.

The booklet corresponding to the drawing can also manage the drawing tables.

Figure 5:
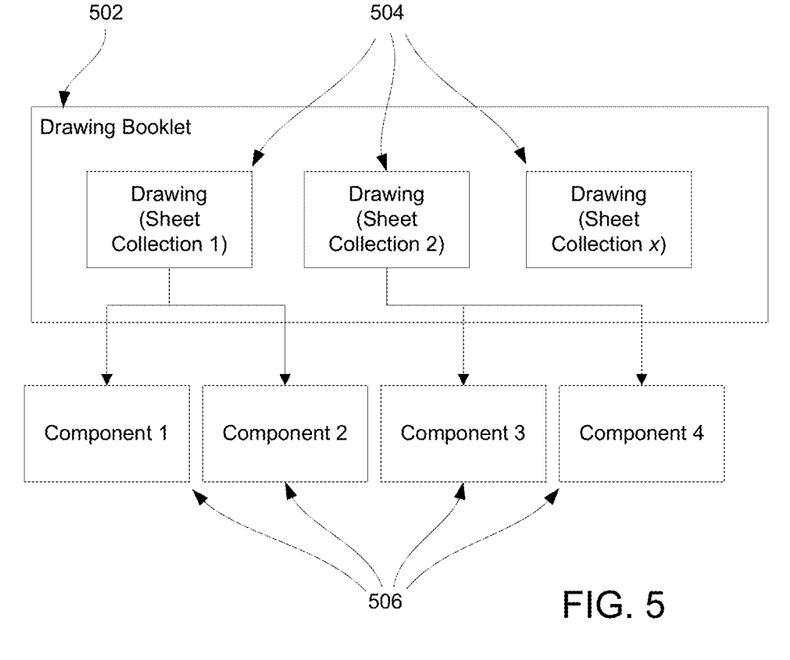
FIG. 5 depicts an example of a booklet structure that can be used in disclosed embodiments.

FIG. 5 depicts an example of a booklet structure that can be used in disclosed embodiments. Each drawing booklet 502 can include or be associated with one or more drawings 504, each of which has a sheet collection. Each drawing 504 can include or be associated with one or more components 506.

An external file or configuration mechanism can be used to relate and configure the drawings 504 in the booklet 502.

The booklet 502 itself is an object that can be managed and revised. Each of the drawings 504 in the booklet 502 may also be managed individually and as part of the booklet 502.

A navigator can be used to present a more complete picture of the full contents of the drawing booklet. When displaying a drawing 504 from a booklet 502 to a user, all of the sheets from the other part containers belonging to that booklet can be shown, regardless of whether or not they are loaded in memory.

Figure 6:
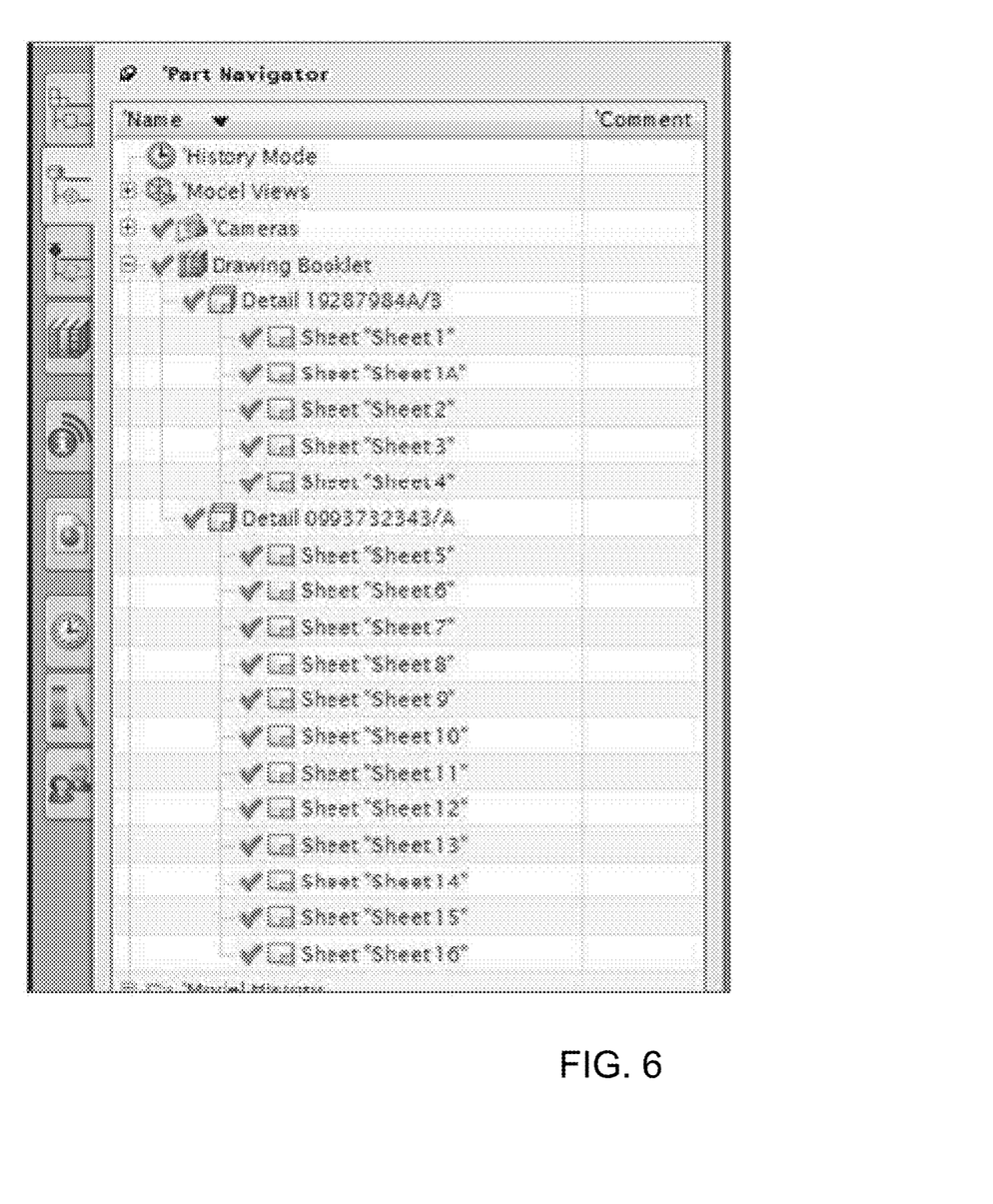
FIG. 6 shows an example of a user display of booklet navigation.

FIG. 6 shows an example of a user display of a booklet. In this example, a tree structure is shown with a drawing booklet. The children of the drawing booklet are the drawing "Detail 19287984A/B", which in turn shows its drawing sheets as children, and the drawing "Detail 0993732343/A", which shows its drawing sheets as children.

The system provides uses with significant new booklet navigation capabilities. There can include:

Sheet Availability. The navigator can present all of the sheets in the booklet. Intermediate nodes can be added to represent the part containers (Item/Revision) of which the sheet collection is a part. Load status of the drawings making up the booklet can be communicated directly in the navigator.

Drawing Booklet. A node can be used in the navigator to represent a drawing booklet, and can be a root node. A specific set of context menu items can be used to operate on the booklet.

Drawing Node. The behavior on the drawing node can be modified based on the load status/visibility of the part. Status icons can be updated to reflect the status of the node. The context menus on the drawing node cab be modified to reflect the behavior provided by drawing booklets.

Sheet Node. The content of the sheet node indicates it is part of a drawing booklet. Views need not be shown in the navigator for non-displayed part container. The context menus on the drawing node can be modified to reflect the behavior provided by drawing booklets.

As sheets are loaded into memory, previously loaded sheets can be automatically unloaded to minimize memory footprint and make resources available to the user.

With drawing booklets as disclosed herein, multiple users have the ability to work on different parts of a single drawing simultaneously since the sheets and drawings can be stored in different physical files on disk.

Booklets enable consistent and accurate sheet numbering across all parts containers in the booklet and allow for reference tables to be constructed that reference views, zones, objects, and other critical information across part containers in the booklet.

The system described herein can receive a user selection of 3D models that can be used to automatically generated assembly and detail drawing booklets.

When preparing to create a drawing the user can select the reference geometry required for creating each of the drawings contained within the drawing booklet. This geometry can be categorized such that it can be grouped for display purposes, use in dimensioning, and inclusion in drawing packages.

The system is able to identify primary/secondary/reference data to define drawing views for assembly drawings and present those to a user through the wizard. Similarly, the system can also identify primary data to define drawing views for detailed drawings.

The automated drawing wizard guides the user through the inputs required to automatically create a series of drawings based on a set of predefined templates, rules, preferences, and defaults. Many of the options available in the wizard are configurable by users in an administrative role so that the wizard can meet the needs of various users and industries.

Figure 7:
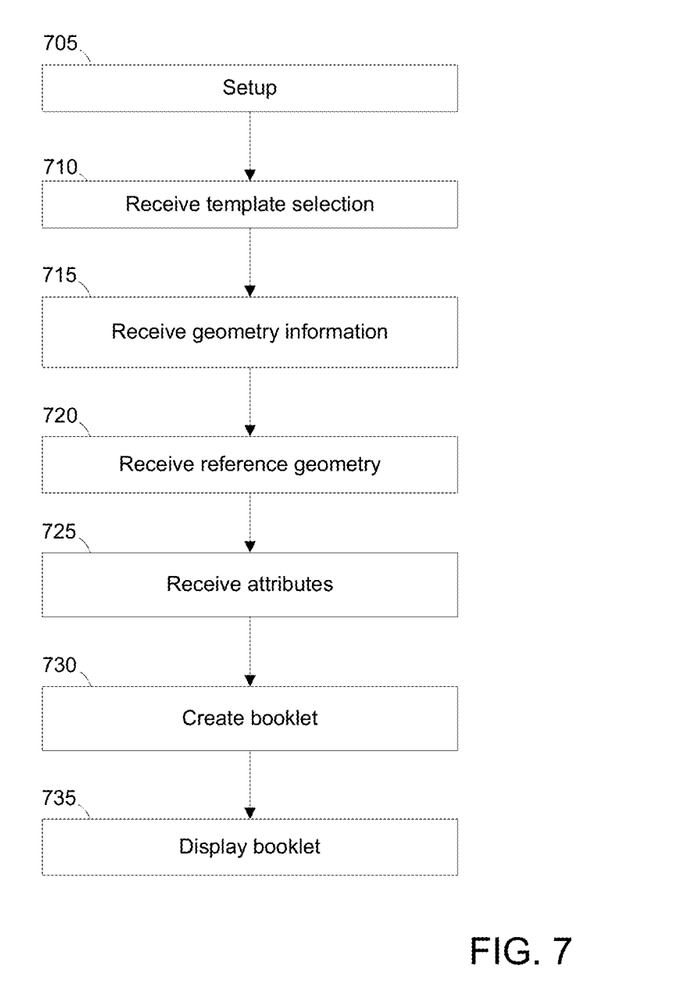
FIG. 7 is a flowchart of a process in accordance with disclosed embodiments.

FIG. 7 is a flowchart of a process in accordance with disclosed embodiments for creating a new booklet or group of drawings provided that may be configured to display or not.

The system performs a setup process (step 705). As part of this step, the system can instantiate the booklet, or can receive a user specification of the template options that will drive the templates and automation rules to use during automation.

The system receives a user selection of a template (step 710). This can be the introductory template to be used during drawing automation.

The system receives geometry content information from a user (step 715). As part of this step, the system can receive a user selection of the parts to make the drawing and the geometry template. The geometry content information can be, for example, parts, assemblies, or other 2D or 3D graphic models or geometry, or other information or elements intended to be part of the geometric content of the drawing.

The system receives reference geometry from a user (step 720). This can be reference geometry that can be used with automated dimensions and annotation.

The system receives attributes from a user (step 725). This can be part attributes to apply to during automation.

The system creates the booklet based on one or more of the template, geometry content information, reference geometry, or attributes (step 730).

The system can display the booklet to the user (step 735). This step can include displaying a summary of the inputs and expected outputs of the booklet.

Once a booklet has been built, the same wizard can be used to add additional content to the booklet.

A drawing booklet as used herein can be a collection of hundreds of related drawings put together to describe a product or its part. In some cases, the booklet can contain drafting objects like views, notes, tables, and dimensions driven by user-defined rules. The rules decide how different drafting objects are created or updated and the level of customization. Simple rules that don't require mathematical or complex logic can be provided as session- and part-specific settings.

Knowledge-Based Engineering (KBE) techniques and languages can used to define non trivial rules. These KBE rules, which capture custom logic/behavior, can be integrated with drawing automation program at run time. The KBE rules can not only capture custom logic but can also be integrated with other systems, processes, and databases through an application programming interface (API). This makes various embodiments described herein programming-language neutral, i.e., users can pick the programming language of their choice for customization. The drawing template function allows specification of KBE rules when defining a template. The rules may be defined for views, annotations, tables, etc. The rules are saved with the template part and evaluated when the template is instantiated to create drawings.

Following is an example of how a view-orientation KBE rule defined in the template is evaluated to set the orientation based on custom logic. After the system has instantiated a template to create a drawing sheet, it can create a view on the sheet. The initial view orientation can be inherited from the template. The system will then evaluate the KBE rule to compute a new orientation based on a custom logic. The system returns the new orientation to the drawing automation process, which sets the new orientation of the view. The system can then continue with the next step of the standard drawing automation process.

The drawing automation process can meet needs of different users since the rule database can change from user to user while the tool behavior and user interface are consistent. It is also easy to enhance the tool by providing additional rules. The rules are highly scalable to meet the needs of different customers.

In various embodiments, the drawing objects can be created and managed based on the rules and can include dimensions, notes, tables, symbols, and views.

Annotation Distribution: The system can create annotations in the views based on the rules, and can ensure that the annotations are readable and located as per user expectations. The readability and location rules determine the annotation distribution. The drafting standards describe these rules and guidelines; however, customers/industries also influence this behavior. A set of rules based on drafting standards and best drafting practices is used to distribute annotations the best possible way. The rules try to minimize overlapping annotations, leaders, and annotations/leaders crossing the geometry. The rules also try to keep annotation location close to geometry or at a reasonable distance from the geometry to improve drawing readability.

Automation rules can include strict rules, which are rules that are always honored and can't be configured. Strict rules can include a display boundary so that all dimensions and annotations are displayed inside a rectangular boundary. The boundary is determined by the drawing layout and will not interfere with other views, regions on the drawing.

Strict rules can also include an annotation text overlap. Text overlap makes it hard to read and understand annotation content. This will always be avoided during the annotation distribution process using this rule.

Strict rules can also include annotation content crossing. According to this rule, the annotation lines crossing the annotation content will be completely avoided.

Rules can also include configurable rules, which are rules that are assigned a relative priority. Their values and behavior can be customized as well. The rules with the higher priorities are likely to be satisfied.

Configurable rules can include a display inside geometry rule to determine if the annotation can be placed inside geometry. If this rule is set true, then the annotation can be displayed inside geometry.

Configurable rules can include a distance to geometry rule that controls where the annotation should be placed. The annotation normally should be placed in a location where it has some distance to the geometry it is associated to, not overlapping on the geometry. Minimum and maximum distance to geometry rules will be defined to control this.

Configurable rules can include a "distance to other annotations" rule that controls the distance between two annotations. Any annotation should be placed in a location where it has some distance to other annotations around it. The distance between two annotations can be defined as distance between the two annotation text boxes. The minimum distance to other annotation rule can be defined to control this.

Configurable rules can include an annotation line crossing rule. This rule indicates that whenever possible, the annotation line crossing among annotations should be avoided. So, the rule will prevent crossing between dimension extension lines and annotation leader lines.

The system can then determine the best location for each annotation by applying both the strict and configurable rules. The rules apply to both the 2D and 3D annotations, the only condition being that the annotations need to be in one plane.

For annotation management, users may run the automation tool again and again for various reasons. The system is flexible enough to allow users to clean up annotations from previous run and create all. In some cases, the system can preserve the annotations from previous run and only create annotations that are not duplicates. Disclosed embodiments provide options to delete or preserve annotations from previous runs and also provides duplicate-annotation-detection capability.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A drawing automation method performed by a computer aided design (CAD) data processing system, comprising:
   performing a setup process to instantiate a booklet of CAD drawings;
   receiving a user selection of a template from a user, the template associated with at least one part to be included in the booklet of CAD drawings and comprising rules including knowledge-based engineering rules;
   receiving geometry content information from the user, the geometry content information including parts to be included in the booklet of CAD drawings;
   receiving reference geometry associated with the parts from a user;
   applying the rules to the parts such that for each part, one or more of the rules is copied to the part and the part is added to a drawing file;
   after instantiating the template to create a drawing sheet of the booklet of CAD drawings, creating a view of a CAD drawing on the drawing sheet, the view of the CAD drawing having a first view orientation;
   setting a second view orientation of the CAD drawing on the drawing sheet different from the first view orientation based at least in part on the knowledge-based engineering rules; and
   creating the booklet of CAD drawings including the drawing sheet based on the template, the knowledge-based engineering rules, the geometry content information and the reference geometry.

2. The method of claim 1, wherein the CAD data processing system also displays the booklet of CAD drawings to the user in the second view orientation that is automatically determined by the CAD data processing system based on view-orientation rules, the view orientation rules based at least in part on the knowledge-based engineering rules.

3. The method of claim 2, wherein the CAD data processing system also displays a summary of inputs and expected outputs of the booklet of CAD drawings.

4. The method of claim 1, wherein the setup process includes receiving template options.

5. The method of claim 1, wherein receiving geometry content information includes receiving a geometry template for a drawing for the booklet of CAD drawings.

6. The method of claim 1, wherein the knowledge-based engineering rules include one or more of rules for views, rules for annotations, and rules for tables.

7. A computer aided design (CAD) data processing system comprising:
   a processor; and an accessible memory, the data processing system particularly configured to
perform a setup process to instantiate a booklet of CAD drawings;
receive a user selection of a template from a user, the template associated with at least one part to be included in the booklet of CAD drawings and comprising rules including knowledge-based engineering rules;
receive geometry content information from the user, the geometry content information including parts to be included in the booklet of CAD drawings;
receive reference geometry associated with the parts from a user;
apply the rules to the parts such that for each part, one or more of the rules is copied to the part and the part is added to a drawing file;
after instantiating the template to create a drawing sheet of the booklet of CAD drawings, create a view of a CAD drawing on the drawing sheet, the view of the CAD drawing having a first view orientation;
set a second view orientation of the CAD drawing on the drawing sheet different from the first view orientation based at least in part on the knowledge-based engineering rules; and
create the booklet of CAD drawings including the drawing sheet based on the template, the knowledge-based engineering rules, the geometry content information and the reference geometry.

8. The data processing system of claim 7, wherein the CAD data processing system also displays the booklet of CAD drawings to the user.

9. The data processing system of claim 8, wherein the CAD data processing system also displays a summary of inputs and expected outputs of the booklet of CAD drawings.

10. The data processing system of claim 7, wherein the setup process includes receiving template options.

11. The data processing system of claim 7, wherein receiving geometry content information includes receiving a geometry template for a drawing for the booklet of CAD drawings.

12. The data processing system of claim 7, wherein the knowledge-based engineering rules include one or more of rules for views, rules for annotations, and rules for tables.

13. A non-transitory computer-readable medium encoded with executable instructions that, when executed, cause one or more computer aided design (CAD) data processing systems to:
perform a setup process to instantiate a booklet of CAD drawings;
receive a user selection of a template from a user, the template associated with at least one part to be included in the booklet of CAD drawings and comprising rules including knowledge-based engineering rules;
receive geometry content information from the user, the geometry content information including parts to be included in the booklet of CAD drawings;
receive reference geometry associated with the parts from a user;
apply the rules to the parts such that for each part, one or more of the rules is copied to the part and the part is added to a drawing file;
after instantiating the template to create a drawing sheet of the booklet of CAD drawings, create a view of a CAD drawing on the drawing sheet, the view of the CAD drawing having a first view orientation;
set a second view orientation of the CAD drawing on the drawing sheet different from the first view orientation based at least in part on the knowledge-based engineering rules; and
create the booklet of CAD drawings including the drawing sheet based on the template, the knowledge-based engineering rules, the geometry content information and the reference geometry.

14. The computer-readable medium of claim 13, wherein the CAD data processing system also displays the booklet of CAD drawings to the user.

15. The computer-readable medium of claim 13, wherein the CAD data processing system also displays a summary of inputs and expected outputs of the booklet of CAD drawings.

16. The computer-readable medium of claim 13, wherein the setup process includes receiving template options.

17. The computer-readable medium of claim 13, wherein the knowledge-based engineering rules include one or more of rules for views, rules for annotations, and rules for tables.

* * * * *